(12) United States Patent
Katagiri et al.

(10) Patent No.: US 6,453,913 B2
(45) Date of Patent: Sep. 24, 2002

(54) METHOD OF CLEANING A FILM DEPOSITION APPARATUS, METHOD OF DRY ETCHING A FILM DEPOSITION APPARATUS, AND AN ARTICLE PRODUCTION METHOD INCLUDING A PROCESS BASED ON THE CLEANING OR DRY ETCHING METHOD

(75) Inventors: Hiroyuki Katagiri; Yoshio Seqi; Hideaki Matsuoka; Koji Hitsuishi; Tetsuya Karaki, all of Shizuoka (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/838,236

(22) Filed: Apr. 20, 2001

(30) Foreign Application Priority Data

Apr. 27, 2000 (JP) ......................................... 2000-126993

(51) Int. Cl.[7] .................................................. B08B 6/00
(52) U.S. Cl. ............................. 134/1.1; 134/18; 134/19; 134/30; 134/36; 134/22.1; 134/902; 216/59; 216/64; 216/67; 438/905
(58) Field of Search ........................... 134/1.1, 19, 22.1, 134/22.18, 18, 30, 36, 42, 59, 902; 216/59, 64, 67; 438/905

(56) References Cited

U.S. PATENT DOCUMENTS

| 5,585,012 A | * | 12/1996 | Wu et al. ....................... 216/71 |
| 5,843,239 A | * | 12/1998 | Shrotriya ..................... 134/1.1 |
| 5,902,403 A | * | 5/1999 | Aitani et al. ................. 118/723 |
| 6,003,526 A | * | 12/1999 | Lo et al. ....................... 134/1.1 |

FOREIGN PATENT DOCUMENTS

| JP | 2720966 | | 3/1998 | |
| JP | 10-163177 | * | 6/1998 | ....... H01L/21/3065 |

* cited by examiner

Primary Examiner—Randy Gulakowski
Assistant Examiner—M Kornakov
(74) Attorney, Agent, or Firm—Fitzpatrick, Cella, Harper & Scinto

(57) ABSTRACT

A method for performing a cleaning process uses a cleaning gas and high-frequency power upon a film deposition apparatus for depositing a film on a substrate placed in a reactor chamber which can be evacuated to a low pressure. Supplying of high-frequency power is temporarily stopped in the middle of the cleaning process, and the cleaning process is restarted by again supplying high-frequency power. This method is capable of effectively removing by-products from the inside of a reactor chamber and makes it possible to form a high-quality deposition film, in particular, a high-quality electrophotographic photosensitive drum.

17 Claims, 4 Drawing Sheets

METHOD OF CLEANING A FILM DEPOSITION APPARATUS, METHOD OF DRY ETCHING A FILM DEPOSITION APPARATUS, AND AN ARTICLE PRODUCTION METHOD INCLUDING A PROCESS BASED ON THE CLEANING OR DRY ETCHING METHOD

BACKGROUND OF THE INVENTION

1. Field of the Invention

The present invention relates to a method of cleaning a film deposition apparatus or a vacuum processing apparatus, a method of dry etching such an apparatus, and an article production method including a process based on the cleaning or dry etching method. More particularly, the present invention relates to a method of cleaning a film deposition apparatus or a vacuum processing apparatus for forming a deposition film on a substrate to produce an electrophotographic photoreceptor or a semiconductor device such as a solar cell, a line sensor for inputting an image, an imaging device, or a TFT, a method of dry etching such an apparatus, and an article production method including a process based on either one of such methods.

2. Description of the Related Art

Various deposition films have been proposed for use in an electrophotographic photoreceptor and a semiconductor device such as a solar cell, a line sensor for inputting an image, an imaging device, and a TFT. An example is a film of amorphous silicon such as that compensated with hydrogen and/or halogen (such as fluorine or chlorine) (hereinafter referred to as "a-Si(H, X)"). Some of them are practically used. Various apparatuses and methods for depositing a film such as a-Si(H, X) are known. Specific examples of film deposition methods include vacuum evaporation, ion plating, sputtering, thermal CVD, plasma CVD, and optical CVD. Of these film deposition methods, a low-pressure method such as plasma CVD is widely used.

When a deposition film is formed on a desired substrate using one of the above methods, the film or a polymer (polysilane) in the form of particles is also deposited on some parts of a film deposition chamber. For example, when a deposition film is formed by means of the plasma CVD method using glow discharge decomposition, the deposition film is formed not only on the substrate but also on various parts other than the substrate, such as the susceptor and the opposite electrode, in the film deposition apparatus (hereinafter also referred to as a "reactor chamber") and on the inner wall of the reactor chamber. The deposition film or polysilane is incorporated as an impurity into a film formed in the next deposition process. Such incorporation of an impurity can cause degradation of the quality of the film. Polysilane deposited on the substrate can cause the film to have a defect. As the film deposition process is repeated, the production yield greatly decreases.

One known technique to avoid the above problem is to clean the inside of the reactor chamber every one or more film deposition cycles to remove the film or polysilane deposited on parts other than where the film should be deposited. One known cleaning method is to use a chemical vapor reaction to reduce the deposited film or elements forming polysilane by means of vapor molecules. In this cleaning method, a gas such as $CF_4$, $NF_3$, or $SF_6$ is used as a cleaning gas and is supplied into the reactor chamber. The cleaning gas supplied into the reactor chamber is excited by energy of plasma, heat, or light so that the gas in the excited state reacts with elements forming the deposited film or particles, thereby converting them into vapor molecules, which are then removed by vacuum pumping means.

In recent years, $ClF_3$ has attracted large attention as an etching gas. $ClF_3$ is decomposed by low energy and is very active. The etching rate of $ClF_3$ is extremely high compared with the etching rates of conventional etching gases.

Various cleaning methods by means of dry etching using $ClF_3$ have been proposed. For example, Japanese Patent No. 2720966 discloses a cleaning method using a gas containing at least one of $ClF$, $ClF_3$, and $ClF_5$. Those methods using $ClF_3$ allow the cleaning to be performed in a highly efficient manner.

In recent years, there has been a need for a further improvement in image quality of electrophotographic apparatuses. In order to meet the above requirement, the resolution of developing a latent image on an electrophotographic photoreceptor has been increasingly improved.

An increase in the speed of copying machines has been also achieved. As a result, the charging process has become critical, that is, charging is needed to be performed in a shorter time. This produces a problem that when no voltage is applied to a certain portion of the surface of the photoreceptor, that portion can have a large influence upon the voltage in neighboring portions, and thus an image defect is produced in that portion.

In conventional electrophotographic apparatuses, the main purpose is to make a copy (line copy) of a document including only character information, and thus an image defect does not practically result in a significant problem. However, in recent more sophisticated copying apparatuses, it is needed to make a high-quality copy of a document including halftone information such as a picture, and an image defect which is not a significant problem in a line copy can result in a significant problem. As a result, an electrophotographic photoreceptor containing a lesser number of defects is needed for use in an electrophotographic photosensitive drum. In particular, in a certain type of electrophotographic copying machine, an image defect is visually prominent, and thus the electrophotographic photosensitive drum needs to includes a still smaller number of defects.

Thus, there has arisen a need to effectively produce an electrophotographic photoreceptor having extremely high quality with a high production yield.

However, the above-described conventional cleaning techniques for removing the undesired deposition film or polysilane remaining in the reactor chamber after forming the desired deposition film have the following problems to be solved to meet the requirements in terms of the characteristics of the articles such as a photoreceptor (photosensitive drum with a very large size).

That is, in the conventional techniques in which polysilane is removed by reacting polysilane with $ClF_3$ gas, the cleaning process needs a long time to remove polysilane to a sufficient degree, and thus it is needed to supply a large amount of $ClF_3$ and a large amount of electric power. Furthermore, the vacuum pumping means, in particular, the rotary pump, needs to continuously suck $ClF_3$ gas for a long time, and a large load is imposed upon the vacuum pumping means. If the removal of polysilane is not sufficient, particles remain mainly on the inner wall of the reactor chamber. It is known that the remaining particles can fly off during a subsequent film deposition process and can form defects in a deposited film.

When a large-sized product which is long in one direction (as with an electrophotographic photosensitive drum) is produced, the remaining deposition film or polysilane is nonuniformly distributed in the reactor chamber, and thus the cleaning process can become nonuniform. This can cause insufficient removal of polysilane and thus can cause the produced electrophotographic photosensitive drum to have a small image defect. Although the size and the density of defects are sufficiently low for use in conventional applications, the defects cannot be neglected in recent sophisticated apparatuses in which high resolution and high image quality are required.

SUMMARY OF THE INVENTION

It is an object of the present invention to provide methods of cleaning and dry etching a film deposition apparatus, capable of effectively removing by-products from the inside of a reactor chamber, sufficiently to make it possible to form high-quality deposition films, and in particular, high-quality electrophotographic photosensitive drums, at a satisfactory speed.

One aspect of the present invention is a method of cleaning a film deposition apparatus for depositing a film on a substrate placed in a reactor chamber which can be evacuated to a low pressure, wherein the cleaning is performed by applying a cleaning gas and high-frequency power, and in which the application of high-frequency power is temporarily stopped in the middle of the cleaning process and then restarted.

Another aspect of the present invention is a method of dry etching a vacuum processing apparatus, including first, second and third dry etching steps. In the first dry etching step, high-frequency power and a dry etching gas are supplied under a low pressure, thereby dry etching an undesired solid substance present in the vacuum processing apparatus. In the second dry etching step, the first dry etching step is stopped by stopping the supplying of the high-frequency power and the dry etching gas, and the undesired solid substance is then further dry etched while the power and gas are no longer being supplied (i.e., during the stopping of the first dry etching step). In the third dry etching step, the second dry etching step is terminated by resuming supplying of the high-frequency power and the dry etching gas, and the undesired solid substance is dry etched. Still another aspect of the present invention is a method of producing an article, including a film depositing step, in which a substrate is placed in a reactor chamber and a film is deposited on the substrate, and a cleaning step. The cleaning step includes three cleaning steps, in the first of which, after completion of the film depositing step, the substrate is taken out of the reactor chamber, and a cleaning gas and high-frequency power are supplied into the reactor chamber. In the second cleaning step, the supplying the cleaning gas and of the high-frequency power is stopped, and in the third cleaning step, the cleaning gas and the high-frequency power are supplied again. After completion of the cleaning step, the film depositing step can be performed again to deposit a film on another substrate.

In various aspects of the present invention, the supplying of the cleaning gas and the high-frequency power is temporarily stopped during the cleaning process so that a moderate reaction occurs between the cleaning gas remaining in the film deposition apparatus and the undesired solid substance (such as the undesired deposition film or polysilane), whereby the undesired substance is further removed under reduced pressure without being intentionally subjected to factors or conditions which would enhance the reaction. Thereafter, the cleaning process is restarted. This method allows the cleaning process to occur in an efficient manner and makes it possible to uniformly form a high-quality deposition film, in particular, a high-quality electrophotographic photosensitive drum (electrophotographic photoreceptor) with good repeatability.

In the present specification, the term "cleaning process" refers to a process including the steps of to supplying a cleaning gas into a reactor chamber of a film deposition apparatus and supplying electric power into the reactor chamber in which the cleaning gas is being supplied. In various aspects of the present invention, the cleaning process preferably further includes the step of stopping supplying the high-frequency power in the middle of the cleaning process and more preferably stopping supplying both the cleaning gas and the high-frequency power. The supplying of the high-frequency power is not necessarily stopped completely; rather, the high-frequency power can merely be substantially stopped by reducing the high-frequency power to a low enough level to generate substantially no discharge.

From another point of view, the cleaning process according to various aspects of the present invention can be regarded as having two cleaning steps, before and after a period during which the supplying of the high-frequency power is stopped or the supplying of both the high-frequency power and the cleaning gas is stopped, wherein, in each of the two cleaning steps, the cleaning gas is supplied into the reactor chamber of the film deposition apparatus and the high-frequency power is supplied into the reactor chamber into which the cleaning gas is being supplied.

In the present specification, the reaction which occurs in the period between the two cleaning steps is referred to as the "moderate reaction". In this moderate reaction, cleaning is also performed, that is, the undesired substance is dry etched.

In the two cleaning steps before and after the moderate reaction period, the etching gas serving as the cleaning gas is supplied into the reactor chamber and the high-frequency power is also supplied into the reactor chamber thereby actively removing the undesired substance. In the moderate reaction period, because the high-frequency power is not supplied into the reactor chamber, or the high-frequency power and the cleaning gas are not supplied, the undesired substance is removed under the reduced pressure in a moderate manner in which no active reaction occurs.

The conditions of supplying the high-frequency power, that is, the frequency and the magnitude of the high-frequency power, may be the same or may be different for the two cleaning steps, i.e., before and after the moderate reaction period. Employing the same conditions is more desirable in that the cleaning process can be performed in a short time using a simple process.

Furthermore, the type of the cleaning gas (dry etching gas) and the flow rate of the cleaning gas (dry etching gas) may be the same or may be different for the respective two cleaning steps (before and after the moderate reaction period). Employing the same type of gas and the same flow rate is more desirable in that the cleaning process can be performed in a short time using a simple process.

The present invention is based upon the following knowledge obtained through an investigation performed by the inventors of the present invention. That is, the inventors expected at an early stage of their investigation that undesired solid substances such as a deposition film or polysilane remaining in the reactor chamber after completion of the film deposition process could be removed by reacting the undesired solid substances with the cleaning gas activated by discharging energy. However, in reality, the cleaning process occurs nonuniformly and the nonuniformity causes residual particles still to remain on the inner wall of the reactor chamber even after the cleaning process. In order to remove the particles perfectly, it is needed to perform the cleaning for a long time, and thus a large amount of cleaning gas and a large amount of electric power are consumed.

The inventors have attempted to remove the particles perfectly by increasing the concentration of the cleaning gas. However, it turned out that a simple increase in the concentration resulted in an increase in the amount of residual particles because of reaction between the cleaning gas and the residual deposition film or particles. That is, a simple increase in the concentration of the cleaning gas resulted in an adverse effect.

The inventors have also attempted to decrease the concentration of the cleaning gas. When the concentration of the cleaning gas was simply reduced, although a moderate reaction was obtained, a reduction in the cleaning speed occurred also, and thus a simple reduction in the concentration of the cleaning gas is not practical. Thus, either a simple increase or reduction in the concentration cannot solve the problem of nonuniformity in cleaning.

The inventors have made a further investigation and have developed an excellent method in which supplying a cleaning gas and high-frequency power into the reactor chamber is temporarily stopped during the cleaning process and is restarted after the temporary stoppage.

During the period in which the supplying of the cleaning gas and the high-frequency power is temporarily stopped, a moderate cleaning process is performed by the cleaning gas remaining in the reactor chamber. This moderate cleaning process allows a reduction in the cleaning nonuniformity and also makes it possible to remove, in a short time, particles which would otherwise remain in the reactor chamber.

It has been found that the cleaning effect can be enhanced by restarting the cleaning process at a different concentration of the cleaning gas. This allows a reduction in the total cleaning time.

The article production method according to the present invention allows the reactor chamber to be cleaned in a highly efficient manner between adjacent two film deposition cycles, making it possible to produce high-quality articles with good reproducibility at low cost.

Further objects, features and advantages of the present invention will become apparent from the following description of the preferred embodiments.

DESCRIPTION OF THE PREFERRED EMBODIMENTS

The preferable embodiments of present invention are described in further detail below with reference to the drawings.

Figure 1:
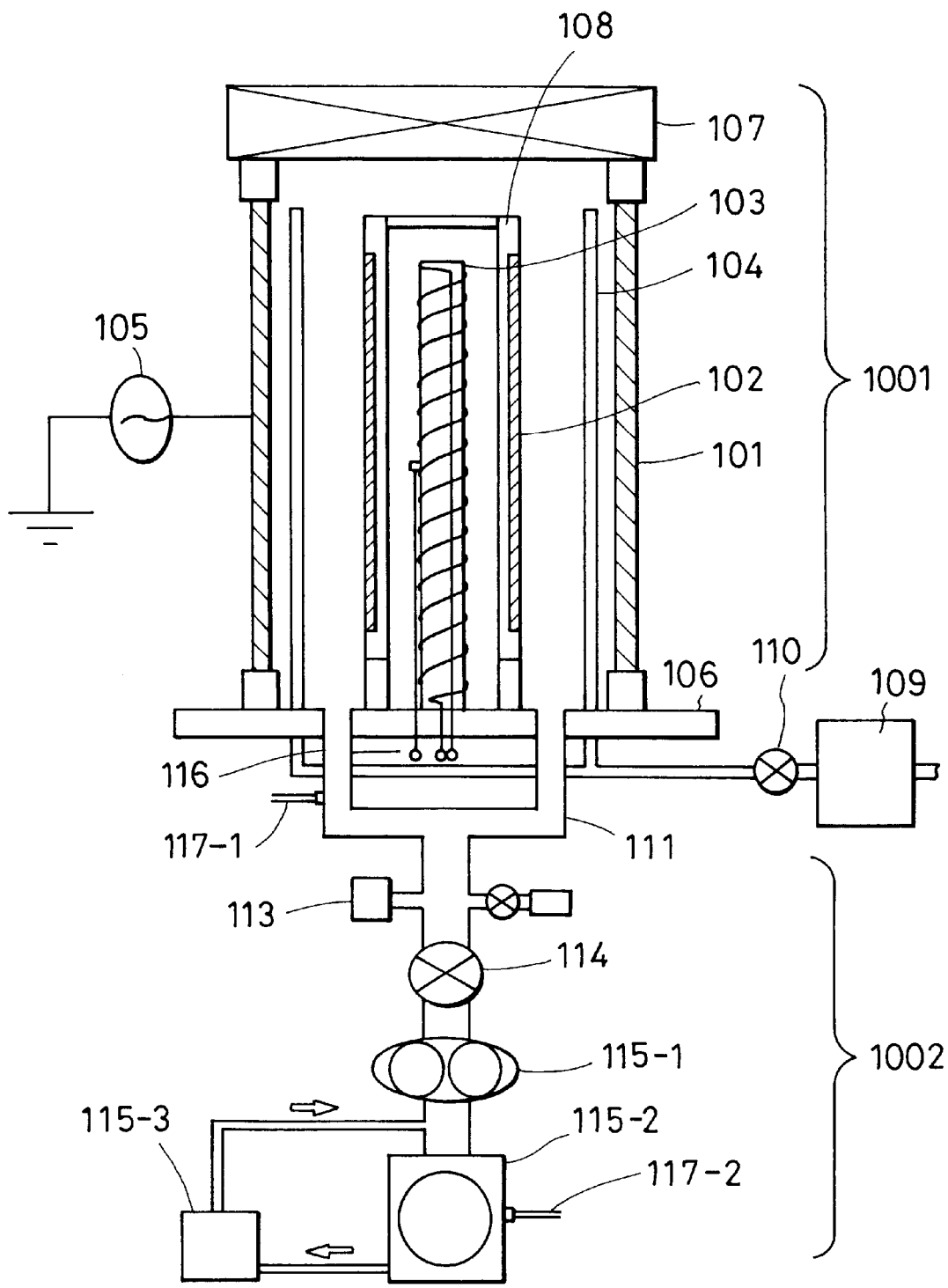
FIG. 1 is a view, partly in cross section, illustrating an example of a film deposition apparatus to which the present invention may be applied.

FIG. 1 is a view, in partly cross section, illustrating an example of a construction of an apparatus for depositing a film for use in an electrophotographic photosensitive drum, according to an embodiment of the present invention. As shown in FIG. 1, the film deposition apparatus includes a reactor chamber unit 1001 and a vacuum pump unit 1002. In a vacuum chamber serving as a reactor chamber 101, there are provided a supporting part of a cylindrical-shaped substrate 102 held by a substrate holder 108, a substrate heater 103 for heating the substrate, and a source gas inlet pipe 104. A high-frequency power supply 105 is connected to the reactor chamber 101 via a matching box (not shown).

When the cylindrical-shaped substrate 102 is placed in the reactor chamber 101, the substrate heater 103 is brought into a space surrounded by the inner wall of the of the cylindrical-shaped substrate 102 and thus the substrate heater 103 is protected by the cylindrical-shaped substrate 102 from being directly exposed to a discharging atmosphere during a discharging process.

A high-frequency power supply 105 supplies power in a frequency band arbitrarily set in, for example, an RF frequency band, a VHF frequency band or a UHF frequency band, or a frequency band including two or more of the above frequency bands (of course, any frequency that will do what is required is within the scope of the invention).

The reactor chamber unit 1001 and the vacuum pump unit 1002 are connected to each other via a base plate 106 on the side of the reactor chamber unit and via an exhaust pipe 111 on the side of the vacuum pump unit. The apparatus may be constructed such that the reactor unit 1001 and the vacuum pump unit 1002 are detachable from each other.

When a cleaning gas is supplied into the reactor chamber via the gas inlet pipe 104, the cleaning gas is forced by the vacuum pump system to flow downward in the reactor chamber toward the exhaust pipe. Thus the cleaning gas enters the exhaust pipe from the reactor chamber and cleans the exhaust pipe and the vacuum pump unit. (It is not meant that no cleaning process occurs in the vacuum pump unit during the period in which the reactor chamber unit is cleaned. Conversely, it is not meant that no cleaning occurs in the reactor chamber unit during the period in which the vacuum pump unit is cleaned. In practice, the film deposition apparatus is cleaned such that the reactor chamber unit is mainly cleaned in an early stage and the vacuum pump unit is mainly cleaned in a later stage.)

A gas source for supplying a gas used to deposit the electrophotographic photosensitive film is connected to the gas inlet pipe 104 extending in the reactor chamber 101, via a mass flow controller 109 and a source gas valve 110.

Gas sources for supplying cleaning gas $ClF_3$ and an inert gas are also connected to the gas inlet pipe 104 extending in the reactor chamber 101, via the mass flow controller 109 and the source gas valve 110.

Using this film deposition apparatus, film deposition and cleaning are performed, for example, as follows.

First, the cylindrical-shaped substrate 102 held by the substrate holder 108 is placed in the reactor chamber 101 via a gate valve 107. The inside of the reactor chamber 101 is then evacuated by a pump system (including a mechanical booster pump 115-1, a rotary pump 115-2, and an oil cleaner 115-3) connected to the exhaust pipe 111 via a valve 114. Thereafter, the cylindrical-shaped substrate 102 is heated to a predetermined temperature in the range of 20° C. to 400° C. and maintained thereat by the substrate heater 103 under the control of a temperature controller (not shown) using a substrate heater temperature monitor 116.

After the temperature of the cylindrical-shaped substrate 102 has reached the predetermined value, a predetermined source gas is supplied into the reactor chamber 101 via the gas inlet pipe 104.

The flow rate of the source gas is adjusted to a predetermined value using the mass flow controller 109. At the same time, the vacuum pump system is controlled so that the pressure in the reactor chamber 101 is maintained at a predetermined value lower than 133 Pa.

After the pressure in the reactor chamber 101 has become stable at the predetermined value, power is supplied from the high-frequency power supply 105 into the reactor chamber 101 via the matching box (not shown) to generate a glow discharge. The discharging energy causes the source gas supplied into the reactor chamber to be decomposed, and, as a result, a film mainly containing silicon is deposited on the cylindrical-shaped substrate 102.

When it is desired to obtain a uniform film, the cylindrical-shaped substrate 102 is rotated at a fixed rotation speed by a driving mechanism (not shown) during the deposition process.

The cleaning of the apparatus is performed as follows.

After completion of the film deposition process, the obtained electrophotographic photosensitive drum is taken out of the reactor chamber 101, and a cleaning substrate (not shown) is mounted in the place of the cylindrical-shaped substrate to protect the substrate heater 103. The reactor chamber 101 including the gas inlet pipe 102 is evacuated to a predetermined pressure by the vacuum pump system including components 115-1 to 115-3.

The flow rate of the cleaning gas is adjusted to a desired value using the mass flow controller 109, and the cleaning gas is supplied into the reactor chamber 101 via the source gas inlet pipe 104.

When the pressure in the reactor chamber 101 has become stable or has reached a predetermined value, power is supplied from the high-frequency power supply 105 into the reactor chamber 101 via the matching box (not shown) to generate a glow discharge.

The discharging energy causes the cleaning gas supplied into the reactor chamber to be decomposed, and by-products present in the reactor chamber 101 including the gas inlet pipe 102 and the exhaust pipe 111 are cleaned.

In the present invention, supplying of the high-frequency power 105 and the cleaning gas may be temporarily stopped in the middle of the cleaning process so that the cleaning is performed in a plurality of steps among which the concentration of the cleaning gas is changed. In the above cleaning process, the timing of stopping the supplying of the high-frequency power 105 and the cleaning gas can be determined using temperature monitors 117-1 and 117-2 and/or internal pressure detecting means 113 disposed at proper locations in the apparatus.

The locations and the number of the temperature monitors are properly determined so that information for determining the timing of stopping or starting the cleaning process is obtained. For example, the temperature monitor 117-1 may be disposed at some place in the path of the exhaust pipe 111. If the temperature monitor 117-1 is disposed at a location near the reactor chamber unit, it becomes possible to detect not only the etching status in the exhaust pipe but also the etching status in the reactor chamber unit by observing the temperature change using this temperature monitor 117-1.

On the other hand, the temperature monitor 117-2 may be disposed in the rotary pump 115-2 which is one component of the vacuum pump system. Disposing the temperature monitor 117-1 in the path of the exhaust pipe 111 makes it possible to directly or indirectly observe the temperature change in the exhaust path and also directly or indirectly observe the temperature of the vacuum pump system.

When undesired substances are removed by being etched by the cleaning gas, a temperature increase occurs. Therefore, if the temperature monitor 117-1 for monitoring the temperature is disposed in the path of the exhaust pipe, it becomes possible to detect that the undesired substance in the exhaust pipe is being etched by detecting an increase in temperature. This makes it possible to determine that the cleaning of the reactor chamber has been substantially completed when a change in the temperate in the exhaust pipe is detected.

On the other hand, the temperature monitor 117-2 disposed on the rotary pump 115-2 makes it possible to detect an increase in temperature in the rotary pump 115-2. The detection of the increase in temperature in the rotary pump makes it possible to prevent the temperature of the rotary pump from becoming too high.

The increase in temperature inside the rotary pump indicates that undesired solid substances present in an upstream portion of the exhaust pipe have been removed and undesired solid substances present in a downstream portion near the rotary pump are now being etched and removed.

Thus, by observing the temperature changes detected by the respective temperature monitors 117-1 and 117-2, it is possible to easily monitor the process of etching and removing undesired solid substances in the reactor chamber and also monitor the process of etching and removing undesired solid substances in the exhaust pipe. This makes it possible to reduce the cleaning time and prevent the cleaning gas from being supplied longer than necessary. That is, it becomes possible to reduce the total cleaning time and the processing cost.

In the cleaning steps, it is desirable to reduce the load imposed upon the vacuum pump 115-2 by supplying a shower of the oil of the vacuum pump 115-2 to the upstream portion of the exhaust pipe via the oil cleaner 115-3, thereby protecting the vacuum pump 115-2.

Specific examples of the cleaning gas used in the present invention include $CF_4$, $CF_4/O_2$, $SF_6$, and $ClF_3$ (chlorine trifluoride). Of these, $ClF_3$ is preferable for use in the present embodiment.

In the present invention, the concentration of the cleaning gas may be adjusted by means of dilution using an inert gas. Specific examples of inert gases for this purpose include He, Ne, and Ar. Of these inert gases, Ar is particularly preferable.

In the present invention, when the concentration of the cleaning gas is too low, the cleaning effect becomes weak. Conversely, if the concentration is too high, the reaction in the cleaning becomes too rapid and the load upon the components of the apparatus such as the vacuum pump becomes high. Therefore, from a practical point of view, it is desirable that the concentration of the cleaning gas be selected within the range of 10% to 70%.

In the present invention, it is preferable to change the concentration of the cleaning gas during the cleaning process.

Although the present invention has effects over a wide range of pressure in the discharging space during the cleaning process, it is preferable that the pressure be selected within the range from 20 Pa to 200 Pa and more preferable from 50 Pa to 120 Pa to obtain a stable discharge and good cleaning effects in a highly reproducible fashion.

When the cleaning according to the present invention is performed upon the exhaust pipe and the vacuum pump for evacuating the reactor chamber to a low pressure, it is desirable to apply a shower of vacuum pump oil to the inlet of the vacuum pump to reduce the load upon the vacuum pump.

In the present invention, it is preferable that the timing of temporarily stopping the supplying of the cleaning gas and the high-frequency power be determined in accordance with the temperatures detected by the temperature monitors disposed in the film deposition apparatus and/or in accordance with the pressure in the film deposition apparatus. In the present invention, the processing times in the respective steps may be set beforehand in accordance with the above determination, and the cleaning may be performed in accordance with the preset times.

The cleaning according to the present invention may also be performed as follows. The cleaning gas and the high-frequency power are stopped after cleaning the inside of the film deposition apparatus to a certain degree. The reactor chamber is then moved to a location different from the location of the film deposition apparatus, and the cleaning is restarted. That is, the cleaning may be performed at different locations and at different times.

That is, in the present invention, the cleaning may be performed simultaneously upon the reactor chamber unit and the vacuum pump unit or separately upon the reactor chamber unit and the vacuum pump unit.

For example, when only one of the reactor chamber unit and the vacuum pump unit needs to be cleaned, only that one is cleaned and the other one, which does not need to be cleaned, may be combined with a spare reactor chamber unit or vacuum pump unit which has been cleaned beforehand so as to form a film deposition apparatus which may be immediately used for film deposition and thus the efficiency of depositing films on substrates can be further improved. In particular, when only the reactor chamber needs to be cleaned, the reactor chamber may be cleaned separately after being removed from the production apparatus. In this case, because evacuation performed during the separate cleaning is not directly concerned with the production, a simple control system can be employed.

In the cleaning process in which the supplying of the power and the supplying of the cleaning gas is stopped in the middle of the cleaning process, the reactor chamber unit and the vacuum pump unit may be separated from each other after stopping the power and the cleaning gas, and one or both of them may be subjected to a following cleaning process, as will be described below with reference to specific examples.

One way is to remove the reactor chamber unit from the vacuum pump unit after undesired solid substances have been removed substantially entirely or to a sufficiently safe degree via the cleaning process, and then clean one or both of them (by means of dry etching).

Another way is to detach the reactor chamber unit and the vacuum pump unit from each other after the reactor chamber has been cleaned substantially perfectly, and then further clean only the vacuum pump unit by means of dry etching.

As described above, when the cleaning is completed for one of the reactor chamber and the vacuum pump unit, the reactor chamber may be maintained at the same location as the film deposition apparatus or may be moved to a different location, and one of the reactor chamber unit and the vacuum pump unit may be advantageously subjected to a further cleaning process.

Although there is no particular limitation on the shape of the substrate, a cylindrical shape is preferable. Although there is no particular limitation on the size of the substrate, it is preferable from a practical point of view that the size of the substrate be selected within the range from 20 mm to 500 mm in diameter and from 10 mm to 1000 mm in length.

Examples of source gases usable in the film deposition according to the present invention include a source gas for forming amorphous silicon, such as silane ($SiH_4$), disilane ($Si_2H_6$), silicon tetrafluoride ($SiF_4$), and silicon hexafluoride ($Si_2F_6$) and a mixture of any combination of them. Examples of dilute gases include hydrogen ($H_2$), argon (Ar), and helium (He). Examples of characteristic modifying gases for modifying the characteristic (such as a band gap) of the deposited film include a gas containing nitrogen such as nitrogen ($N_2$) and ammonia ($NH_3$), a gas containing oxygen such as oxygen ($O_2$), nitrogen monoxide (NO), nitrogen dioxide ($NO_2$), dinitrogen monoxide ($N_2O$), carbon monoxide (CO), and carbon dioxide ($CO_2$), a hydrocarbon such as methane ($CH_4$), ethane ($C_2H_6$), ethylene ($C_2H_4$), acetylene ($C_2H_2$), and propane ($C_3H_8$), a fluorine compound such as germanium tetrafluoride ($GeF_4$) and nitrogen fluoride ($NF_3$), and a mixture of any combination of the above gases.

Furthermore, for the purpose of doping, a dopant gas such as diborane ($B_2H6$), boron fluoride ($BF_3$), or phosphine ($PH_3$) may be supplied together with a source gas into the discharging space.

In the electrophotographic photosensitive drum according to the present invention, although the total thickness of the film deposited on the substrate may be determined in accordance with a characteristic required for the deposited film, the film thickness is preferably selected within the range from 5 $\mu$m to 100 $\mu$m, more preferably within the range from 10 $\mu$m to 70 $\mu$m, and most preferably within the range from 15 $\mu$m to 50 $\mu$m, to realize an electrophotographic photosensitive drum capable of forming an extremely high-quality image at a low cost.

In the production of an electrophotographic photosensitive drum according to the present invention, the pressure in the discharging space during the film deposition process may be properly determined. Preferably, the pressure is selected in the range from 0.06 Pa to 13.3 Pa and more preferably in the range from 0.133 Pa to 6.65 Pa to obtain good stability in discharging and to obtain good reproducibility in production in particular in terms of the uniformity of the deposited film.

The substrate temperature during the film deposition process is preferably selected in the range from 100° C. to 500° C., more preferably from 150° C. to 450° C., still more preferably from 200° C. to 400° C., and most preferably from 250° C. to 350° C.

Most heaters designed to be used in a vacuum may be employed as means for heating the substrates. Specific examples of such heating means include an electric resistance heater such as a winding heater in the form of a sheath, a plate heater, and a ceramic heater, a thermal radiation heater such as a halogen lamp and an infrared lamp, and a heater by means of heat exchange using a medium such as a liquid or gas. Metal such as stainless steel, nickel, and aluminum, ceramic, a heat-resistant macromolecular resin may be used as the surface material of the heating means. Furthermore, in addition to the reactor chamber, a chamber dedicated to heating may be provided, and the substrate may be transferred into the reactor chamber via a vacuum path after heating the substrate.

In the present invention, the above means may be used individually or a combination of them may be used.

The cleaning process according to the present invention may be used not only to clean a film deposition apparatus after completion of a film deposition process but also to clean a film deposition apparatus which is to be used for the first time.

In the present invention, the film deposition process may include a sequence of steps of placing a substrate on which a film is to be deposited into the film deposition apparatus, depositing a film on the substrate, and taking the substrate on which the film has been deposited out of the film deposition apparatus. The film deposition process may also include a plurality of cycles wherein each cycle includes a sequence of steps of placing a substrate on which a film is to be deposited into the film deposition apparatus, depositing a film on the substrate, and taking the substrate on which the film has been deposited out of the film deposition apparatus. After completion of one cycle, a succeeding cycle is started in which another substrate is placed into the film deposition apparatus, a film is deposited on that substrate, and the substrate is taken out of the film deposition apparatus.

The present invention is described in further detail below with reference to specific examples. Note that the present invention is not limited to those examples.

EXAMPLE 1

Figure 2:
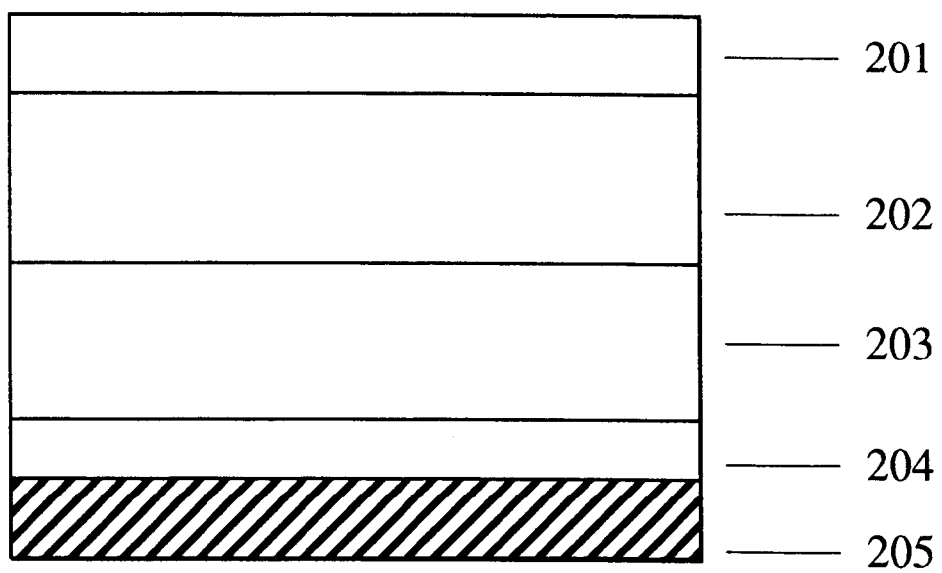
FIG. 2 is a cross-sectional view illustrating an example of a structure of an electrophotographic photoreceptor.

In Example 1, an amorphous silicon film was deposited on a cylindrical aluminum substrate having a size of 108 mm in diameter, 358 mm in length and 5 mm in thickness using the film deposition apparatus shown in FIG. 1 under the conditions, shown in Table 1, thereby producing a blocking-type electrophotographic photosensitive drum having the layer structure shown in FIG. 2. Many electrophotographic photoreceptors were produced via a plurality of deposition cycles, and the reactor chamber was cleaned in each deposition cycle under the cleaning conditions, shown in Table 2.

In FIG. 2, reference numeral 205 denotes an electrically conductive substrate 205, and reference numeral 204 denotes a carrier injection blocking layer (first layer) 204. Reference numerals 203 and 202 denote photoconductive layers (second and third layers) having different compositions. Reference numeral 201 denotes a surface protection layer (fourth layer).

Figure 3:
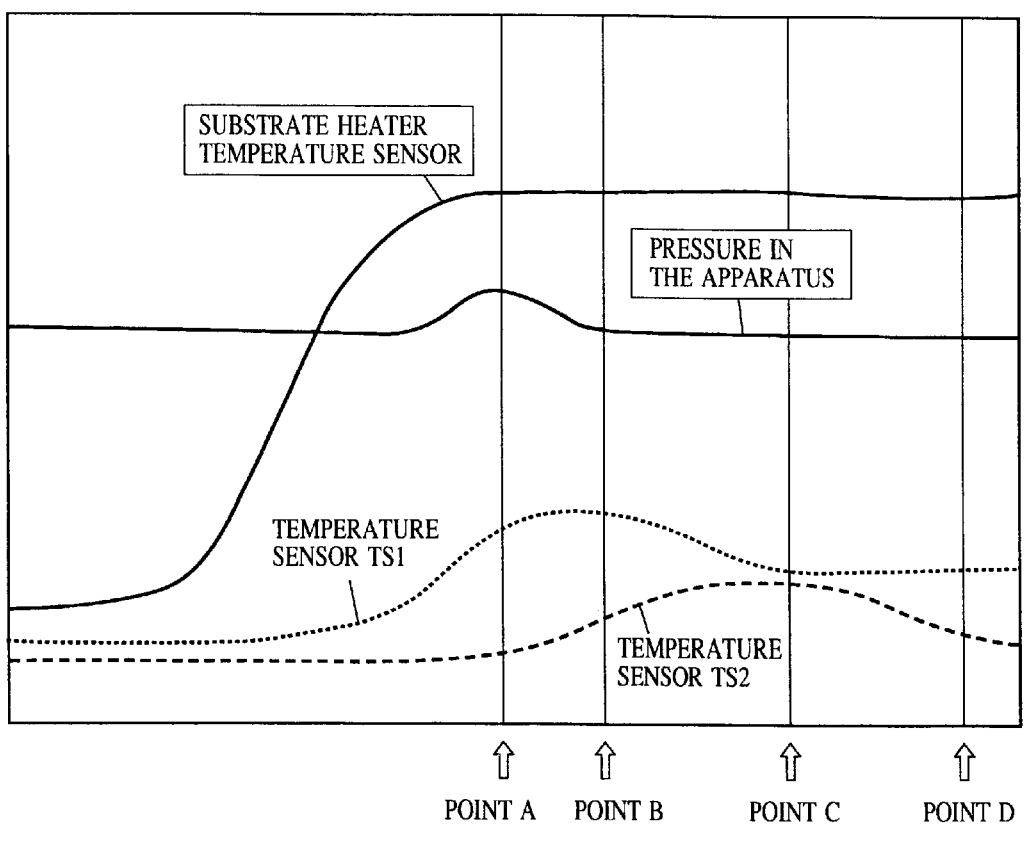
FIG. 3 is a graph illustrating an example of the timing of stopping a cleaning gas and high-frequency power.

The timing of stopping the mixed gas of $ClF_3$ and Ar and the high-frequency power was selected at one of the points shown in FIG. 3. When the cleaning process was restarted, the mixed gas of $ClF_3$ and Ar was first introduced into the reactor chamber and the high-frequency power was supplied after the pressure of the mixed gas in the reactor chamber had become stable. The rotary pump which is one component of the vacuum pump system was subjected to showering.

In the present example, the timing of stopping the supplying the mixed gas of $ClF_3$ and Ar and the high-frequency power was selected as described below with reference to FIG. 3.

FIG. 3 is a graph illustrating the timing of stopping the cleaning gas and the high-frequency power, in which the horizontal axis (X-axis) represents time.

As shown in FIG. 3, the pressure in the apparatus increased in the middle of the cleaning process. Although the reason for that is not absolutely understood, a possible reason is that a gas was produced as a result of the reaction between the cleaning gas and an undesired solid substance and thus an increase in the pressure occurred. However, the pressure returned to the initial fixed value when the undesired solid substance had been removed.

The temperature sensor TS1 indicates the change in temperature detected by the temperature sensor 117-1 shown in FIG. 1. The temperature indicated by TS1 also increased in the middle of the process. This is probably because a strong reaction occurred between the cleaning gas and the undesired solid substance present in the reactor chamber unit rather than the undesired solid substance present in the vacuum pump unit, whereby the undesired solid substance in the reactor chamber unit was etched and removed. After completion of the removal of the undesired solid substance, the temperature decreased.

The temperature sensor TS2 indicates the change in temperature detected by the temperature sensor 117-2 shown in FIG. 1. The temperature indicated by TS1 also increased in the middle of the process. This is probably because when the reaction of the cleaning gas with the substance in the reactor chamber was entirely or substantially entirely completed, a strong reaction between the cleaning gas and the undesired solid substance in the vacuum pump apparatus 115-2 started, and the substance was etched and removed. After completion of the removal of the undesired solid substance, the temperature decreased.

Thus, points A, B, C, and D shown in FIG. 3 provide information on the basis of which the timing of stopping the supplying of the high-frequency power and the cleaning gas can be determined.

That is, points A, B, C, and D shown in FIG. 3 provide information indicating when the strong removal of the undesired substance by means of the plasma discharging should be stopped and the moderate cleaning process should be started.

More specifically, the discharging is stopped twice in the process which advances along the X-axis in FIG. 3.

That is, the cleaning process includes a step (a), in which the high-frequency power and the cleaning gas are supplied and the cleaning is performed, a step (b), in which the high-frequency power and the cleaning gas are stopped and the moderate cleaning is performed, a step (c), in which the high-frequency power and the cleaning gas are supplied again and the cleaning is performed, and a step (d), in which the high-frequency power and the cleaning gas are stopped again and the moderate cleaning is performed. The step (b) may be started in response to detection of the point A or B or may be started at a time between the points A and B. The step (d) may be started in response to detection of the points B and C or the points C and D or may be started at a time between the points C and D. Note that the timings are not limited to the period between the points A and B or between the points C and D, but the timings of starting the steps may be properly adjusted depending upon the situation.

It is not necessary to start the step (b) or (d) exactly at one of the labeled points A, B, C, and D. One of points may be selected and the timing of starting the step (b) or (d) may be properly determined on the basis of the selection point.

Of course, the step (b) or (d) may be started exactly at a selected labeled point.

FIG. 3 does not show points indicating when the step (a) should be started, or when the step (b) should be ended and the step (c) should be started. For example, the step (c) may be started when a predetermined period has elapsed since the start of the step (b) or may be started when a predetermined change in temperature has been detected.

The timing of starting the step (c) may be preferably determined in a simple manner such that the step (c) is started when a predetermined period has been elapsed since the start of the step (b).

The pressure in the apparatus has a peak at the point A or near it. This peak of the pressure indicates that a strong reaction is occurring between the cleaning gas and the undesired substance.

At the point B or near it, a rapid reduction in the internal pressure of the apparatus is substantially completed. The point B is located at or near the point A at which the temperature detected by the temperature sensor TS1 of the temperature monitor 117-1 becomes maximum.

At the point D, the temperature detected by the temperature sensor TS1 of the temperature monitor 117-1 is substantially constant, and the temperature detected by the temperature sensor TS2 of the temperature monitor 117-2 is decreasing or has reached a constant value after the reduction. The determination of the timing of starting the step (d) is not very critical.

The electrophotographic characteristics of the electrophotographic photosensitive drums produced in the above-described manner were evaluated as follows. The produced electrophotographic photosensitive drums were installed in respective Canon copying machines NP6060 which were modified so that the processing speed could be arbitrarily adjusted within the range from 200 to 800 mm/sec. Corona charging was performed by applying a voltage of 6 to 7 V to a charger, and images were formed on transfer sheets using a usual copying process. The electrophotographic characteristics and the image quality were evaluated. Table 3 shows the results of the evaluation of the respective items for the electrophotographic photosensitive drums produced under the same production condition. In Table 3, the total cleaning times are represented in relative values (in percentage) with respect to the total cleaning time employed in comparative example 1 (see below).

Evaluation of External Appearance

The external appearance of the produced electrophotographic photosensitive drums was observed to visually evaluate, by naked eyes, the presence of grouped defects caused by abnormal growth.

In Table 3, the evaluation results are represented as follows:

⊙: Excellent

○: The defect size and the defect density were low enough not to be easily detected, and there was no problem.

Δ: Although defects were observed, the defect size and the defect density were not significantly high.

x: Defects were easily observed and the defect size and the defect density were significantly large.

Evaluation of Image Defects Scattered Along a Line

Copies of a document including a halftone image over the entire area and a character document were made at various processing speeds. The image samples including the greatest number of image defects were selected, and the image defects were analyzed. The evaluation was performed by observing the image samples via an optical magnifier, and the states of white defects observed in an equal area were evaluated.

In Table 3, the evaluation results are represented as follows:

⊙: Excellent

○: Although some white defects were observed, the defect size and the defect density were low enough not to result in a problem.

Δ: Although small white defects were observed over the entire area, characters could be read without any problems.

x: Defects were easily observed and the defect size and the defect density were significantly large.

Evaluation of Line Defects

Copies of a test chart (product number FY9-9058, available from Canon Inc.) including characters over the entire area were made by exposing the test chart to an amount of light twice a normal amount of exposure light. The obtained images were observed to evaluate whether the images includes a line defect which separates a line image into two parts, and the images were classified into the following four grades. When an image included nonuniformity, the evaluation was performed for the worst portion in the entire image area.

⊙: Excellent

○: Good

Δ: Although a large number of line defects were observed, characters could be read without any practical problems.

x: A large number of line defects were observed, and there was difficulty in reading characters, which would result in practical problems.

Evaluation of Cleaning

After completion of cleaning, various portions (such as a source gas inlet hole) in the inside of the reactor chamber were observed to evaluate the cleaning quality. In Table 3, the evaluation results are represented as follows:

⊙: cleaning was perfect.

○: Although a reaction residual was observed in the inside of the exhaust pipe, the amount of residual was so small not to cause any practical problem.

Δ: Although a reaction residual was observed on the bottom of reactor chamber, the amount of residual was not so great to cause a significant problem.

x: A small amount of reaction residual was observed on the inner wall of the reactor chamber.

TABLE 1

| Layer Number | Source Gas | Flow Rate (ml/min(normal)) | Substrate Temperate (° C.) | Internal Pressure (Pa) | Applied Power (mW/cm$^3$) | Film Thickness ($\mu$m) |
|---|---|---|---|---|---|---|
| 1 | SiH$_4$ | 100 | 250 | 60 | 10 | 3 |
|   | H$_2$ | 600 |   |   |   |   |
|   | NO | 5 |   |   |   |   |
|   | B$_2$H$_6$ | 1500 ppm (relative to SiH$_4$) |   |   |   |   |
| 2 | SiH$_4$ | 100 | 250 | 73 | 15 | 25 |
|   | H$_2$ | 800 |   |   |   |   |
|   | B$_2$H$_6$ | 0.3 ppm (relative to SiH$_4$) |   |   |   |   |
| 3 | SiH$_4$ | 100 | 250 | 73 | 15 | 5 |
|   | H$_2$ | 800 |   |   |   |   |
|   | B$_2$H$_6$ | 0.1 ppm (relative to SiH$_4$) |   |   |   |   |
| 4 | SiH$_4$ | 30 | 250 | 67 | 10 | 0.5 |
|   | CH$_4$ | 600 |   |   |   |   |

TABLE 2

| ClF3/(ClF3 + Ar) (%) | Internal Pressure (Pa) | Applied Power (W) |
|---|---|---|
| 35 | 106 | 1800 |

TABLE 3

| | Initial Stopping Point | External Appearance | Defects Scattered Along Line | Line Defects | Cleaning Time | Cleaning Quality |
|---|---|---|---|---|---|---|
| Example 1 | Point A | ⊙ | ⊙ | ⊙ | 98% | ○ |
|  | Point B | ⊙ | ⊙ | ⊙ | 95% | ○ |
| Example 2 | Point B | ⊙ | ○ | ○ | 97% | ⊙ |
| Comparative Example 1 | | ⊙ | ○ | ○ | 100% | ○ |

The above evaluation indicates that a good result can be obtained if the supplying of the source gas and the high-frequency power is temporarily stopped in the middle of the cleaning process after the point B at which the abrupt pressure change is completed.

COMPARATIVE EXAMPLE 1

Electrophotographic photosensitive drums were produced in a manner similar to Example 1 except that the supplying of $ClF_3$ gas and the high-frequency power was not stopped during the cleaning process. The evaluation was performed in a manner similar to Example 1, and the results are also shown in Table 3.

EXAMPLE 2

In Example, 2 the cleaning process was performed in a manner similar to Example 1 except that the cleaning process was completed at the point D, thereby producing electrophotographic photosensitive drums. The evaluation was performed in a similar manner to Example 1, and the results are shown in Table 3.

EXAMPLE 3

In Example 3, electrophotographic photosensitive drums were produced in a similar manner to Example 1 except that the concentration of the source gas was changed such that the concentration was different as between the cleaning steps before and after stopping the source gas and the high-frequency power, as shown in Table 4. The evaluation was performed in a similar manner to Example 1.

The cost required for the cleaning was also evaluated (in percentage) relative to the cost for the Comparative Example 1.

The results are shown in Table 5. Note that the timing of stopping the source gas and the high-frequency power was selected in a manner similar to Example 1.

TABLE 4

| Processing Pressure (Pa) | Concentration Before Stopping | Concentration After Stopping | Power |
|---|---|---|---|
| 100 | 35% | 25% | 1800 W |

TABLE 5

| | External Appearance | Defects Scattered Along Line | Line Defects | Cleaning Time | Cost | Cleaning Quality |
|---|---|---|---|---|---|---|
| Example 3 | ⊙ | ⊙ | ⊙ | 98% | 90% | ⊙ |
| Comparative Example 1 | ⊙ | ○ | ○ | 100% | 100% | ○ |

The results shown in Table 5 indicate that the change in the concentration of the source gas has a good effect.

EXAMPLE 4

In Example 4, the cleaning process was performed and electrophotographic photosensitive drums were produced in a manner similar to Example 1 except that the internal pressure was changed as shown in Table 6, and the supplying of the source gas and the high-frequency power was stopped at points 2 and 4. In addition to a similar evaluation to Example 1, defects in the films due to abnormal growth were evaluated. The cost required for the cleaning was also evaluated (in percentage) relative to the cost for the Comparative Example 1. The results are shown in Table 7.

Evaluation of Defects in the films

The surfaces of the obtained electrophotographic photosensitive drums were observed via an optical microscope, and the number and the size of defects in the films due to abnormal growth were evaluated. In Table 7, the evaluation results are represented as follows:

⊙: The defect density was very low, and a excellent result was obtained.

○: Although a small number of defects were observed, there was no problem.

Δ: A relative large number of defects were observed, but the size was rather small, and the problem was not very significant.

x: A large number of line defects were observed, and the size was large.

TABLE 6

| | Processing Pressure (Pa) | Concentration of Cleaning Gas (Wt %) | Power (W) |
|---|---|---|---|
| Before Stopping | 99 | 35 | 1800 |
| After Stopping | 106 | 25 | 1800 |

TABLE 7

|  | External Appearance | Defects Scattered Along Line | Line Defects | Cleaning Time | Cost | Film Defects | Cleaning Quality |
|---|---|---|---|---|---|---|---|
| Example 3 | ⊚ | ⊚ | ⊚ | 88% | 88% | ⊚ | ⊚ |
| Comparative Example 1 | ⊚ | ○ | ○ | 100% | 100% | ○ | ○ |

From the results shown in Table 7, it can be seen that the effective cleaning time can be reduced by properly selecting the internal pressure and the concentration of the cleaning gas. The reduction in the cleaning time results in a reduction in the amount of gas consumed. In addition, a great reduction in the number of defects in the films of the produced electrophotographic photosensitive drums was achieved.

EXAMPLE 5

In Example 5, the cleaning process was performed in a manner similar to Example 3. The time at which the temperature detected by the temperature sensor TS1 shown in FIG. 3 had a maximum value was compared with the time in Example 3 and the time in Comparative Example 1, wherein the times are represented in relative values (in percentage) with respect to the time in Comparative Example 1.

TABLE 8

|  | Time to Peak |
|---|---|
| Example 5 | 92% |
| Example 3 | 95% |
| Comparative Example 1 | 100% |

As can be seen from Table 8, the proper adjustment of the internal pressure and the concentration of the cleaning gas makes it possible to effectively perform the cleaning of the apparatus including the exhaust pipe.

EXAMPLE 6

In Example 6, the cleaning process was performed in a manner similar to Example 1 except that the timing of stopping the mixed gas of $ClF_3$ and Ar and the high-frequency power was determined on the basis of the period needed to achieve point B. Obtained deposition films were evaluated in a manner similar to Example 1, and good results were obtained.

EXAMPLE 7

In Example 7, the cleaning process was performed in a manner similar to Example 1 except that the timing of stopping the mixed gas of $ClF_3$ and Ar and the high-frequency power was determined on the basis of the period needed to achieve the point A. Obtained deposition films were evaluated in a manner similar to Example 1, and good results were obtained.

TABLE 9

| Layer Number | Source Gas | Flow Rate (ml/min(normal)) | Substrate Temperate (° C.) | Internal Pressure (Pa) | Applied Power (mW/cm³) | Film Thickness (µm) |
|---|---|---|---|---|---|---|
| 1 | $SiH_4$<br>$H_2$<br>NO<br>$B_2H_6$ | 100<br>600<br>5<br>1500 ppm<br>(relative to $SiH_4$) | 250 | 60 | 10 | 3 |
| 2 | $SiH_4$<br>$H_2$<br>$B_2H_6$ | 100<br>800<br>0.3 ppm<br>(relative to $SiH_4$) | 250 | 73 | 17 | 25 |
| 3 | $SiH_4$<br>$H_2$ | 380<br>380 | 250 | 73 | 17 | 1 |
| 4 | $SiH_4$<br>$CH_4$ | 30<br>540 | 250 | 67 | 10 | 0.5 |

EXAMPLE 8

Figure 4:
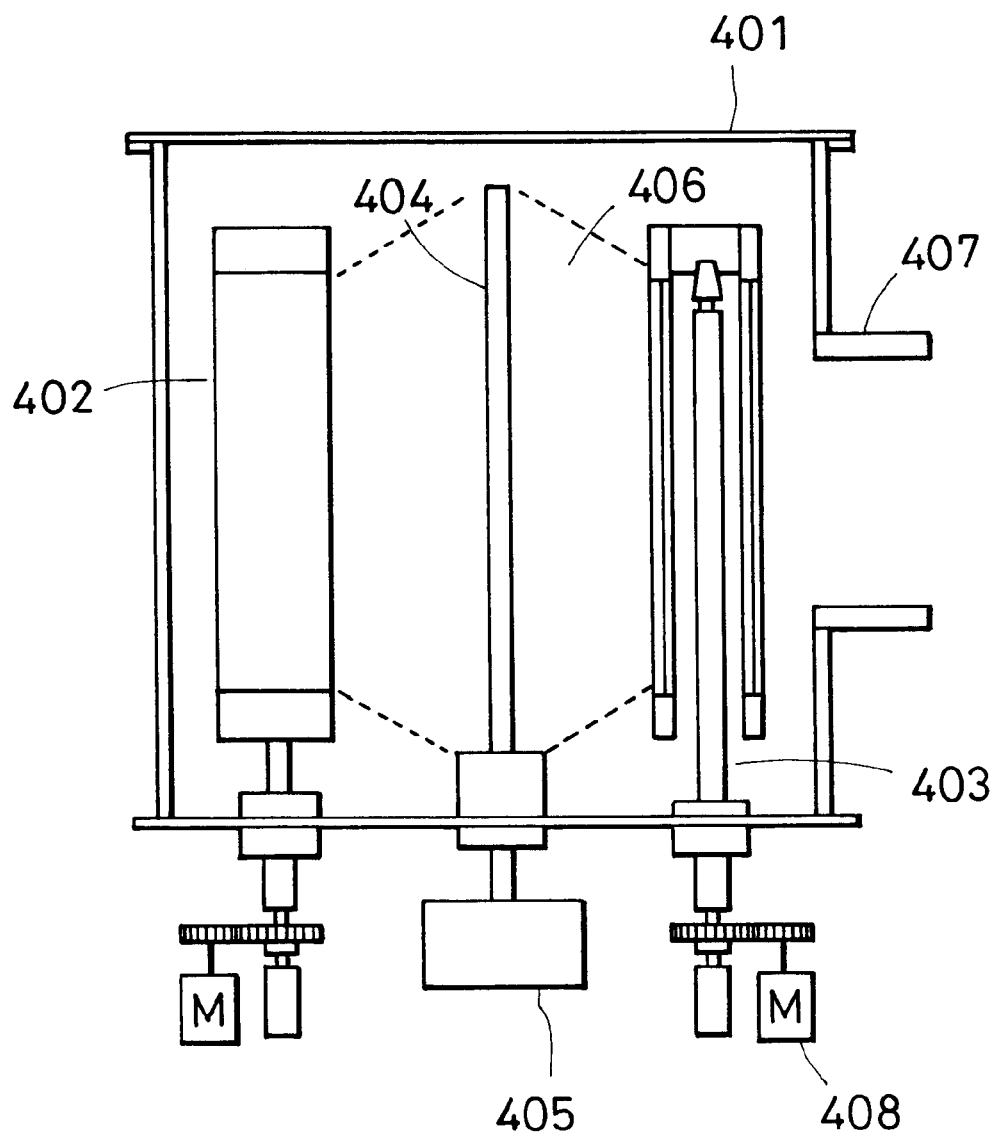
FIG. 4 is a schematic diagram illustrating a reactor chamber of a film deposition apparatus using high-frequency power in a VHF range.

In Example 8, the cleaning process was performed in a manner similar to Example 1 except that electrophotographic photosensitive drums were produced in a plurality of deposition cycles using a VHF PCVD apparatus shown in FIG. 4 under the conditions shown in Table 9. As shown in FIG. 4, the VHF PCVD apparatus includes a reactor chamber 401, a heater 403, a VHF electrode 404 also serving as a gas input pipe, a mass flow controller 405, a discharging space 406, and a driving device 408, wherein an electrically conductive substrate 402 is placed in the apparatus.

Obtained deposition films were evaluated in a manner similar to Example 1, and excellent results were obtained.

Using the present invention, as described above, by-products can be removed from the inside of the reactor chamber by temporarily stopping supplying of the high-frequency power, or more preferably, by temporarily stopping both the high-frequency power and the cleaning gas in the middle of the cleaning process and restarting the cleaning process after the temporary stopping, thereby making it possible to form a high-quality deposition film, in particular, a high-quality electrophotographic photosensitive drum, with good repeatability.

When the cleaning process is restarted, if the concentration of the cleaning gas is changed from the previous concentration, the reaction can be enhanced and thus the cleaning process is performed in a more efficient manner.

While the present invention has been described above with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method of performing a cleaning process upon a film deposition apparatus for depositing a film on a substrate placed in a reactor chamber which can be evacuated to a low pressure, said cleaning process comprising:

a first cleaning step in which high-frequency power and a cleaning gas are supplied to generate a discharge in the reactor chamber for cleaning the film deposition apparatus;

a second cleaning step in which the discharge is stopped and no additional cleaning gas is supplied, after said first cleaning step; and a third cleaning step, in which the supply of high-frequency power and a cleaning gas are resumed to generate a discharge in the reactor chamber for cleaning the film deposition apparatus, after said second cleaning step.

2. A method of performing a cleaning process upon a film deposition apparatus, according to claim 1, wherein a second cleaning step of the cleaning process includes the contents of a reaction of the cleaning gas remaining in the film deposition apparatus which occurs when the supplying of the high-frequency power is stopped.

3. A method of performing a cleaning process upon a film deposition apparatus, according to claim 1, wherein the concentration of the cleaning gas used in a third cleaning step is different from the concentration of the cleaning gas used in a first or a second cleaning step.

4. A method of performing a cleaning process upon a film deposition apparatus, according to claim 1, wherein the cleaning gas is a mixture of $ClF_3$ and an inert gas.

5. A method of performing a cleaning process upon a film deposition apparatus, according to claim 4, wherein the inert gas is Ar.

6. A method of performing a cleaning process upon a film deposition apparatus, according to claim 1, wherein the temperature or the pressure in the film deposition apparatus is detected and the timing of stopping supplying the high-frequency power in the cleaning process is determined on the basis of a result of the detection of the temperature or pressure.

7. A method of performing a cleaning process upon a film deposition apparatus, according to claim 1, wherein a period during which the supplying of the cleaning gas is stopped is completely equivalent to the period during which the supplying of the high-frequency power is stopped.

8. A method of performing a cleaning process upon a film deposition apparatus, according to claim 1, wherein the supplying of the cleaning gas is temporarily stopped and restarted in synchronization with the temporary stopping and restarting of the supplying of the high-frequency power.

9. A method of performing a cleaning process upon a film deposition apparatus, according to claim 7, wherein the period during which the supplying of a cleaning gas is temporarily stopped is determined on the basis of the temperature or the pressure in the film deposition apparatus.

10. A method of performing a cleaning process upon a film deposition apparatus, according to claim 1, wherein the temperature or the pressure in the film deposition apparatus is detected and the timing of stopping supplying the high-frequency power in a second step is predetermined on a result of the detection of the temperature or the pressure, and thus the processing time before temporarily stopping the high-frequency power is preset on the basis of the predetermined timing, and wherein the cleaning process is performed in accordance with the preset processing time.

11. A method of performing a cleaning process upon a film deposition apparatus, according to claim 1, wherein supplying the high-frequency power starts when the pressure of the cleaning gas in the reactor chamber has reached a predetermined value after supplying the cleaning gas into the reactor chamber.

12. A method of performing a cleaning process upon a film deposition apparatus, according to claim 1, wherein the cleaning process includes the steps of, after temporarily stopping supplying the cleaning gas and the high-frequency power during the cleaning process in a second step, moving a reactor chamber unit, forming a part of the film deposition apparatus, to a location different from a location where the film deposition apparatus is installed, and restarting the cleaning process in a third step upon the reactor chamber unit and upon the vacuum pump unit at the same time or at different times.

13. A process for dry etching an undesired solid substance present in the vacuum processing apparatus, comprising:

a first dry etching step in which high-frequency power and a dry etching gas are supplied to generate a discharge under a low pressure;

a second dry etching step, in which the discharge is stopped and no additional dry etching gas is supplied; and a third dry etching step, in which the supply of high-frequency power and the dry etching gas are resumed to generate a discharge after said second drying step.

14. A method of producing an article, comprising:

a film depositing step, in which a substrate is placed in a reactor chamber and a film is deposited on the substrate; and a cleaning step including:

a first cleaning step, in which, after completion of said film depositing step, the substrate is taken out of the reactor chamber, and a cleaning gas and high-frequency power are supplied into the reactor chamber;

a second cleaning step, in which the supplying of the high-frequency power is stopped and no additional cleaning gas is supplied; and a third cleaning step, in which the supply of cleaning gas and the high-frequency power are resumed, wherein after completion of said cleaning step, said film depositing step is performed to deposit a film on another substrate.

15. A method of producing an article, according to claim 14, wherein, in said second cleaning step, the supplying of the cleaning gas is stopped.

16. A method of producing an article, according to claim 14, wherein the article includes an electrophotographic photoreceptor.

17. A method of performing a cleaning process upon a film deposition apparatus, according to claim 1 for depositing a film on a substrate placed in a reactor chamber which can be evacuated to a low pressure, said cleaning process being performed using a cleaning gas and high-frequency power, wherein the concentration of the cleaning gas in said first cleaning step is higher than the concentration of the cleaning gas in said second cleaning step and higher than that in the third cleaning step, and the internal pressure in the reactor chamber in said first cleaning step is lower than in said second cleaning step, and is lower than that in the third cleaning step.

* * * * *

UNITED STATES PATENT AND TRADEMARK OFFICE
CERTIFICATE OF CORRECTION

PATENT NO. : 6,453,913 B2
DATED : September 24, 2002
INVENTOR(S) : Hiroyuki Katagiri et al.

It is certified that error appears in the above-identified patent and that said Letters Patent is hereby corrected as shown below:

<u>Title page,</u>
Item [75], Inventors, "Seqi;" should read -- Segi; --.

<u>Column 4,</u>
Line 7, "of to" should read -- of --.

<u>Column 20,</u>
Line 12, "apparatus," should read -- apparatus --.

Signed and Sealed this

Fourth Day of March, 2003

JAMES E. ROGAN
*Director of the United States Patent and Trademark Office*